United States Patent [19]

Suzuki

[11] Patent Number: 5,630,044
[45] Date of Patent: May 13, 1997

[54] MEMORY FAULT RECOVERY SYSTEM WHICH EXECUTES DEGRADATION OR RECOVERY OF MEMORY

[75] Inventor: Takashi Suzuki, Tokyo, Japan

[73] Assignee: NEC Corporation, Tokyo, Japan

[21] Appl. No.: 624,957

[22] Filed: Mar. 25, 1996

Related U.S. Application Data

[63] Continuation of Ser. No. 268,111, Jul. 6, 1994.

[30] Foreign Application Priority Data

Jul. 6, 1993 [JP] Japan ................... 5-166738

[51] Int. Cl.⁶ .................................................. G06F 11/00
[52] U.S. Cl. .................................................. 395/182.03
[58] Field of Search ........................ 395/182.03, 183.18, 395/375, 800; 364/943.9, 285.3, 944.61, 945, 945.2; 371/40.1

[56] References Cited

U.S. PATENT DOCUMENTS 4,703,481  10/1987  Fremont ....................... 371/12
4,740,969  4/1988   Fremont ....................... 371/12
5,295,258  3/1994   Jewett et al. ................ 395/575
5,502,728  3/1996   Smith, III .................. 395/182.03

FOREIGN PATENT DOCUMENTS 63-41943  2/1988  Japan .

*Primary Examiner*—Robert W. Beausoliel, Jr.
*Assistant Examiner*—Stephen C. Elmore
*Attorney, Agent, or Firm*—Foley & Lardner

[57] ABSTRACT

A system for memory fault recovery in an information processor has been described herein. When a fault recovery section detects a fault in a memory in each of logic units contained in the information processor, a fault memory control section searches a fault memory control table for identification information of the memory whose fault is detected, and gives instructions as to degradation of the memory specified by the memory identification information if the identification information of the detected memory is registered. A fault monitoring timer section measures a time elapsed since the registration of memory identification information in the fault memory control table and deletes identification information of a memory whose registration time period exceeds a prescribed time period.

8 Claims, 9 Drawing Sheets

FIG.6

FAULT MEMORY CONTROL TABLE 22a

41a TABLE AREA FOR PROCESSING UNIT 11

| MEMORY IDENTIFICATION INFORMATION | REGISTRATION TIME AND DATE INFORMATION |
|---|---|
| ⋮ | ⋮ |
| MEMORY IDENTIFICATION INFORMATION | REGISTRATION TIME AND DATE INFORMATION |

41a-1 MEMORY "1" AREA 41a-n MEMORY "n" AREA 51  52

FIG.8

FAULT MEMORY CONTROL TABLE 22b

41b TABLE AREA FOR PROCESSING UNIT 11

| MEMORY IDENTIFICATION INFORMATION | REGISTRATION TIME AND DATE INFORMATION | THE NUMBER OF OC-CURRENCES OF ERROR |
|---|---|---|
| | | |
| MEMORY IDENTIFICATION INFORMATION | REGISTRATION TIME AND DATE INFORMATION | THE NUMBER OF OC-CURRENCES OF ERROR |

41b-1 MEMORY "1" AREA 41b-n MEMORY "n" AREA 51   52   53

FIG.9

61 RECOVERY NODE DESIGNATION AREA

| V | RECOVERY MODE | ERROR COUNT |
|---|---|---|
|   |   |   |
|   |   |   |
|   |   |   |

61-1 MEMORY "1" AREA 61-n MEMORY "n" AREA 71, 72, 73

MEMORY FAULT RECOVERY SYSTEM WHICH EXECUTES DEGRADATION OR RECOVERY OF MEMORY

This application is a continuation, of application Ser. No. 08/268,111, filed Jul. 6, 1994.

BACKGROUND OF THE INVENTION

1. Field of the Invention

The present invention relates to a memory fault recovery system which executes recovery of a fault memory in a processing unit (CPU:central processing unit) constituting an information processor.

2. Description of the Related Arti

A conventional fault or failure recovery system of this kind is recited in, for example, Japanese Patent Laying-Open No. 41943/1988. Under the fault recovery system, when a memory fault is found in a processing unit and if degradation of the function is possible, the part at fault is immediately degraded to try another execution of the operation of the unit.

In this fault recovery method, if the part at fault in a processing unit can be degraded, degradation operation immediately follows the degradation processing. This method therefore has a disadvantage in that degradation of function is always executed even for a fault requiring no degradation.

In recent years, as the integration density of memories has grown, intermittent faults derived from soft errors are found in memories more frequently. In many instances, such intermittent memory faults can be overcome by rewriting the memory. Unconditional degradation of such memory whose fault is recoverable would lead to low system performance. On the other hand, the above-described degradation has no drawback for a fault found in parts of a processing unit other than other memories, because in many cases such fault is not an intermittent but fixed one whose recovery is hard.

SUMMARY OF THE INVENTION

A first object of the present invention is to provide a memory fault recovery system capable of distinguishing between a temporal or intermittent fault which is derived from soft error etc., and is recoverable, and a fixed fault which is hard to recover, to avoid unnecessary degradation as much as possible, thereby preventing reduction of the system performance caused by unnecessary degradation processing.

A second object of the present invention is to provide a memory fault recovery system capable of accurately determining whether a memory fault is a temporal or intermittent fault which can recover, or a fixed fault that is hard to recover, to reliably avoid unnecessary degradation, thereby effectively preventing reduction of the system performance caused by degradation.

A third object of the present invention is to provide a memory fault recovery system capable of more reliably avoiding unnecessary degradation and effectively executing recovery processing by selectively giving instructions on degradation processing and other processing based on the frequency of faults.

According to one aspect of the invention, a memory fault recovery system in an information processor includes fault recovering means for detecting a memory fault occurring in each of logic units contained in the information processor and recovering the memory fault. There is also a fault memory registering means for registering identification information of the memory whose fault is detected. Also provided is a fault memory controlling means for searching the fault memory registering means for the identification information of the memory whose fault is detected by the fault recovering means, and instructing the fault recovering means on degradation of the memory indicated by the memory identification information when the identification information of the detected memory is registered.

In the preferred construction, the fault memory controlling means newly registers the identification information of the memory whose fault is detected in the fault memory registering means when the identification information of the memory is not registered in the fault memory registering means.

Also, the fault memory registering means includes a table having areas provided for each memory in the logic units for storing the identification information, and the fault memory controlling means registers the identification information of the memory whose fault is detected in the corresponding one of the areas of the table.

According to another aspect of the invention, a memory fault recovery system in an information processor includes fault recovering means for detecting a memory fault occurring in each of logic units contained in the information processor and recovering the memory fault. There is also fault memory registering means for registering identification information of the memory whose fault is detected. A fault memory controlling means is for searching the fault memory controlling means for searching said fault memory registering means for the identification information of the memory whose fault is detected by the fault recovering means to instruct the fault recovering means on degradation of the memory indicated by the identification information when the identification information of the detected memory is registered and to newly register the identification information of the memory in the fault memory registering means when the identification information is not registered. There is a registration monitoring means for measuring a time elapsed since the registration of identification information of the memories registered in the fault memory registering means to delete the identification information of the memories whose registration time period exceeds a fixed time period.

In the preferred construction, the fault memory registering means includes a table having areas provided for each memory in the logic units for storing the memory identification information, and the fault memory controlling means registers the identification information of the memory whose fault is detected in the corresponding one of the areas in the table.

In the above-mentioned construction, the fault memory registering means includes a table having areas provided for each memory in the logic units for storing the memory identification information and registration time and date of the memory identification information, the fault memory controlling means registers the identification information and the registration time and date of the memory whose fault is detected in the corresponding one of the areas in the table, and the registration monitoring means measures a time elapsed since the registration of the memory identification information based on the registration time and date registered in the fault memory registering means.

Also, the registration monitoring means is started every time the fault memory controlling means newly registers the identification information of the memory in the fault memory registering means.

According to a further aspect of the invention, a memory fault recovery system in an information processor includes fault recovering means for detecting a memory fault occurring in each of logic units contained in the information processor and recovering the memory fault. There is a fault memory registering means for registering identification information of the memory whose fault is detected and the number of occurrences of fault for each memory.

A processing mode designating means designates degradation and other recovery modes for the memory and the reference number of occurrences of fault corresponding to the processing modes for the each memory, controlling means counts up the number of occurrences of fault corresponding to the memory identification information in the fault memory registering means when the identification information of the memory whose fault is detected by fault recovering means is registered in the fault memory registering means, and selects the recovery modes corresponding to the reference number of occurrences of fault matching the number of occurrences of error in the fault memory registering means to instruct the fault recovering means to execute the recovery. Also, there is a registration monitoring means for measuring a time elapsed since the registration of the memory identification information in the fault memory registering means to delete the identification information of the memory whose registration period exceeds a prescribed time period.

In the preferred construction, the fault memory registering means includes a table having areas provided for each memory in the logic units for storing the memory identification information, the number of occurrences of fault and registration time and date of the memory identification information. The fault memory controlling means registers the identification information, the number of occurrences of fault and the registration time and date of the memory whose fault is detected in the corresponding areas of the table. The registration monitoring means measures a time elapsed since the registration of the memory identification information based on the registration time and date registered in the fault memory registering means.

Also, the registration monitoring means is started every time the fault memory controlling means newly registers the identification information of the memory in the fault memory registering means.

In the above-mentioned construction, the fault memory controlling means searches the fault memory registering means for the identification information of the memory whose fault is detected by the fault recovering means. It counts up the number of occurrences of fault corresponding to the memory identification information in the fault memory registering means when the identification information of the detected memory is registered. It also newly registers the memory identification information in the fault memory registering means when the identification information of the detected memory is not registered. Also, it selects the recovery mode corresponding to the reference number of occurrences of fault matching the number of occurrences of fault in the fault memory registering means to instruct the fault recovering means to execute the recovery.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitations to the invention, but are for explanation and understanding only.

In the drawings:

FIG. 6 is a diagram showing an example of an arrangement of a fault memory control table in the memory fault recovery system according to the second embodiment.

FIG. 8 is a diagram showing an example of an arrangement of a fault memory control table in the memory fault recovery system according to the third embodiment.

FIG. 9 is a diagram showing an example of an arrangement of processing mode designation areas for the fault memory control table of FIG. 7.

DESCRIPTION OF THE PREFERRED EMBODIMENT

Preferred embodiments of the present invention will be described in detail with reference to the accompanying drawings.

Figure 1:
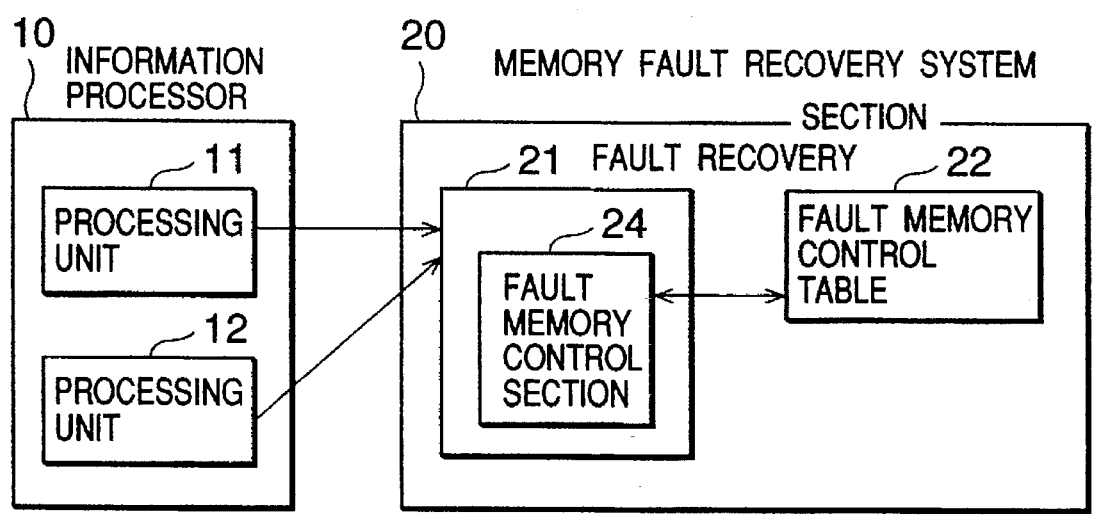
FIG. 1 is a block diagram showing a system arrangement employing a memory fault recovery system according to a first embodiment of the present invention.

Description will be first given of the first embodiment of the present invention. As illustrated in FIG. 1, the system according to the first embodiment comprises a multiprocessor type information processor 10 including a plurality of processing units (CPU) 11 and 12, and a memory fault recovery system 20 according to the present invention for executing recovery of a memory fault in the information processor 10.

The memory fault recovery system 20 of the present embodiment executes detection and recovery of faults of various memories, such as a storage for operation decoding and a firmware control storage, contained in the processing units 11 and 12 in the information processor 10.

The memory fault recovery system 20 comprises a fault recovery section (fault recovery program) 21 for executing recovery of memory faults in the processing units 11 and 12, a fault memory control table 22, where memory identification information is registered to identify a fault memory as an error memory, and a fault memory control section (fault memory control program) 24 for registering memory identification information in the fault memory control table 22 and giving instructions on degradation of the memory based on registration contents.

More specifically, the above fault recovery section 21 monitors the state of memories in the processing units 11 and 12, and when detecting a memory at fault, the section 21 sends memory identification information for identifying the fault memory (information specifying a kind and location of a memory) to the fault memory control section 24.

Upon receiving the memory identification information, the fault memory control section 24 searches the fault memory control table 22 based on the memory identification information and determines whether or not the memory identification information of the fault memory (the memory specified by the memory information) is already registered (that is, the memory was at fault before).

When the memory identification information is not registered, the sent memory identification information is newly registered in the fault memory control table 22. When the memory identification information is already registered, the fault memory control section 24 gives instructions to the processing units 11 and 12 on the execute degradation of the memory specified by the memory identification information.

Figure 3:
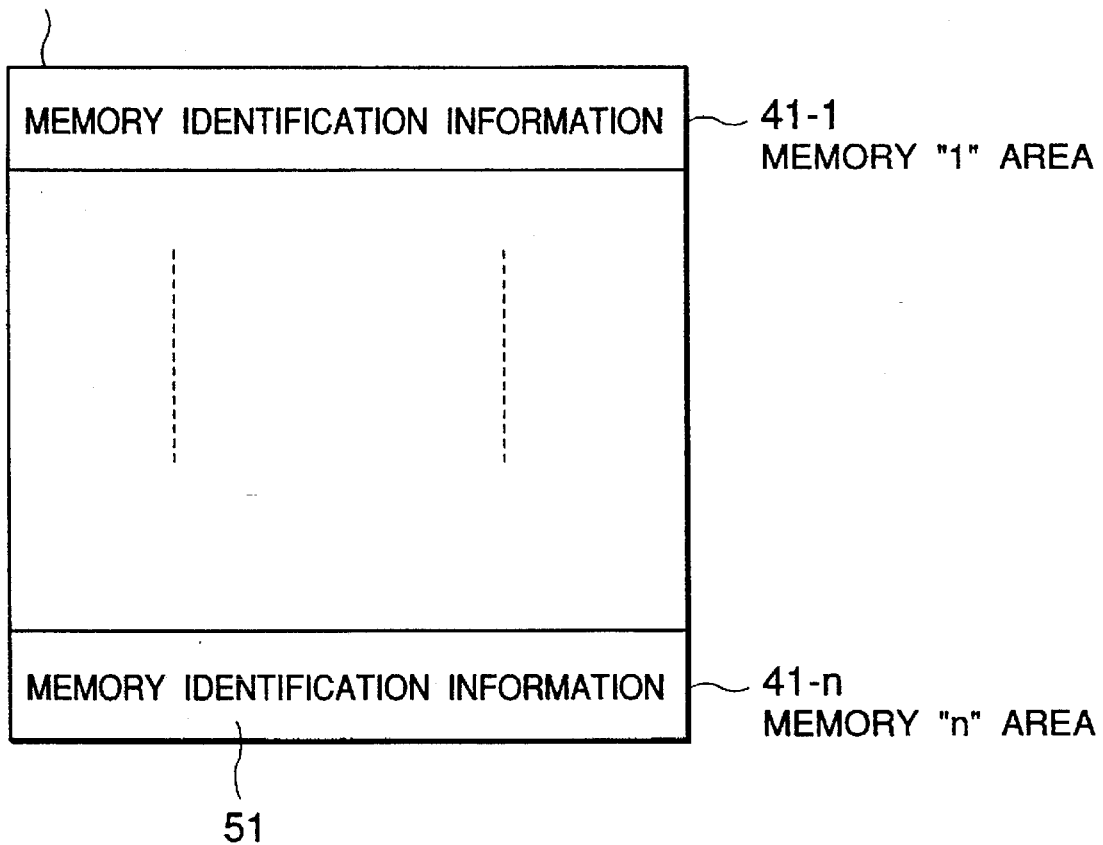
FIG. 3 is a diagram showing an example of an arrangement of a fault memory control table in the memory fault recovery system according to the first embodiment.

FIG. 3 shows an example of an arrangement of the fault memory control table 22. There is shown a table area 41 for the processing unit 11, which area is provided in the fault memory control table 22 for registering memory identification information of the processing unit 11. Similar area is provided for registering memory identification information of the processing unit 12, illustration of which is omitted from FIG. 3.

In the table area 41, a plurality of block areas 41-1 to 41-n are provided corresponding to memories "1" to "n" contained in the processing unit 11. Memory identification information 51 for each of the memories "1" to "n" is registered in the block areas 41-1 to 41-n. For example, the memory identification information 51 registered in the block area 41-1 for the memory "1" denotes an error occurring in the memory "1" in the processing unit 11.

Figure 2:
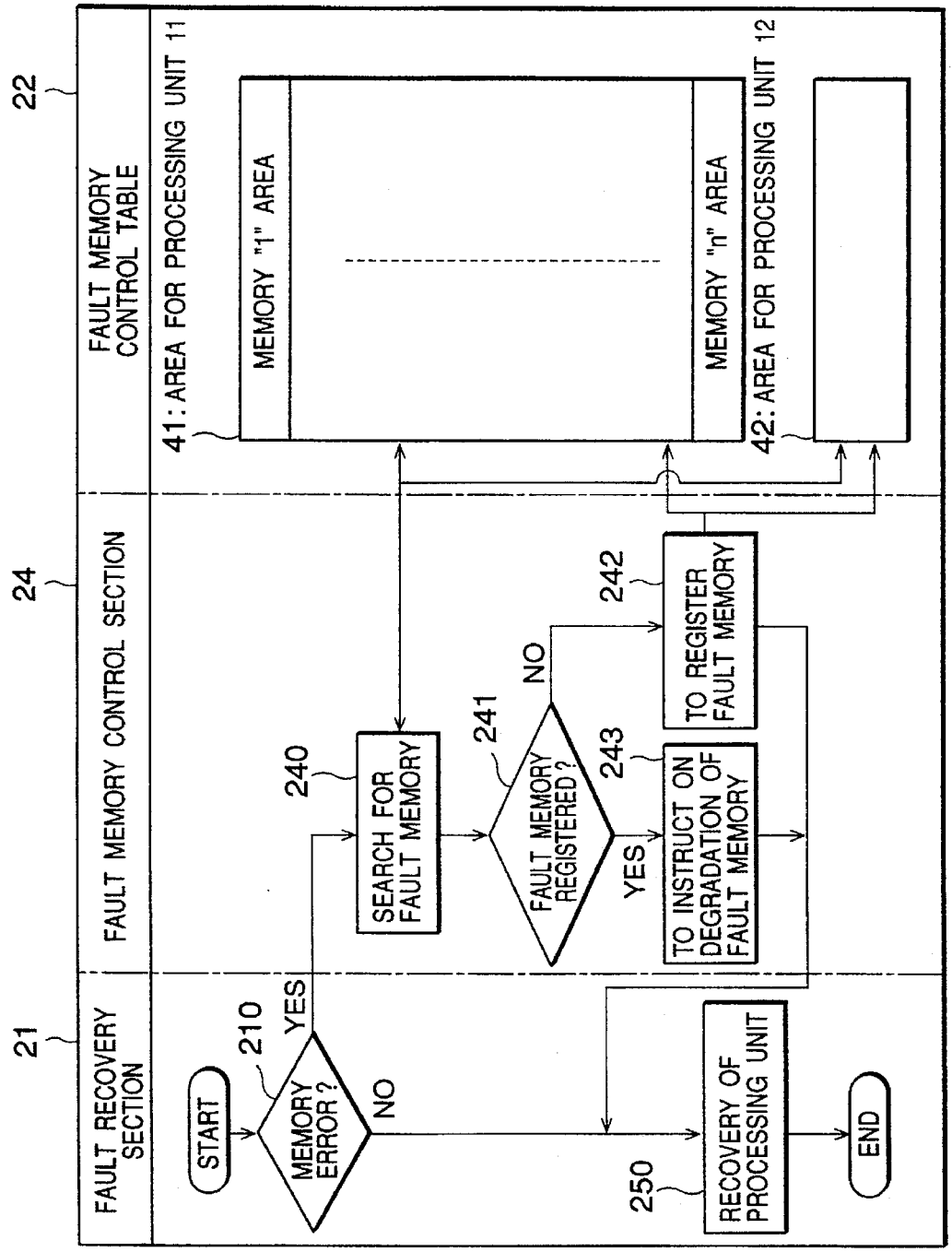
FIG. 2 is a flow chart illustrating operation of the memory fault recovery system according to the first embodiment.

With reference to FIG. 2, description will be given of the operation of the memory fault recovery system 20 according to the first embodiment.

First, the fault recovery section 21 of the memory fault recovery system 20 determines whether an error occurs in a memory in the processing units 11 and 12 (Step 210). When the determination is made that an error arises, the section 21 sends to the fault memory control section 24 the memory identification information 51 (e.g. information on the location of a memory in the processing unit) for identifying a memory in error to call up the fault memory control section 24.

Based on the memory identification information 51 received from the fault recovery section 21, the fault memory control section 24 searches areas 41 and 42 corresponding to the processing units 11 and 12 in the fault memory control table 22 (Step 240).

Then, based on the search result of the fault memory control table 22, the fault memory control section 24 determines whether the memory identification information 51 of the memory in error is already registered in a corresponding one of the block areas (41-1 to 41-n) in the areas 41 and 42 (Step 241).

When the memory identification information 51 of the memory in error is not registered in the fault memory control table 22, which indicates that the memory has newly developed an error, the fault memory control section 24 registers the received memory identification information 51 in a corresponding one of the block areas (41-1 to 41-n) in the areas 41 and 42 of the fault memory control table 22 (Step 242).

Already registered memory identification information 51 of a memory in error in the fault memory control table 22 denotes that the memory developed an error before and now develops another. In this case, determining that the already registered memory is fixedly at fault, the section 24 sends instructions on the degradation of the memory area specified by the memory identification information 51 to the processing unit 11 or 12 that includes the memory in error (Step 243). Then, with respect to the processing unit 11 or 12 stopped due to the memory fault, the fault recovery section 21 executes degradation based on the degradation instructions from the fault memory control section 24, or recovery of the memory such as clear and correction (Step 250).

As described above, the memory fault recovery system 20 of the first embodiment recognizes a memory fault as a temporal (intermittent) or a fixed fault by determining whether or not the memory identification information 51 of a memory in error is already registered in the fault memory control table 22.

More specifically, when the memory identification information 51 of the memory at fault sent from the fault recovery section 21 is not registered in the fault memory control table 22, it is unknown whether the memory fault is a fixed fault requiring degradation. Therefore, the memory identification information 51 is temporarily (intermittently) registered in the fault memory control table 22 and no instructions on degradation are given.

On the other hand, when the memory identification information 51 is registered in the fault memory control table 22, the determination is made that the memory has a fixed fault requiring degradation to give degradation instructions in a manner as described above.

As compared with unconditional memory degradation, the foregoing process can decrease the frequency of degradation processing to prevent the reduction of the system performance caused by degradation as much as possible.

Figure 4:
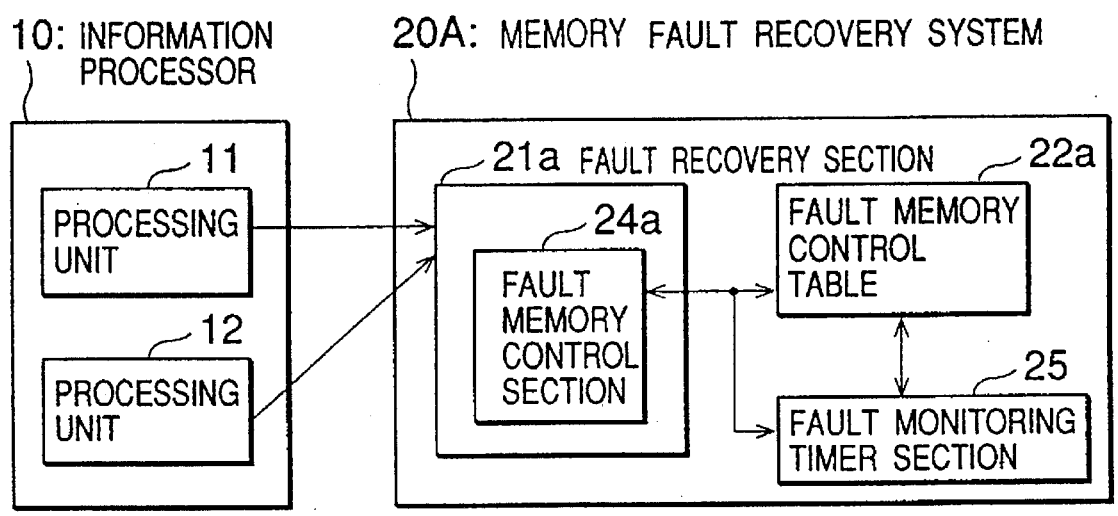
FIG. 4 is a block diagram showing a system arrangement employing a memory fault recovery system according to a second embodiment of the present invention.

The second embodiment of the present invention will be described in the following. As illustrated in FIG. 4, a memory fault recovery system 20a of the second embodiment comprises a fault recovery section 21a, a fault memory control section 24a and a fault memory control table 22a as in the first embodiment shown in FIG. 1, and further comprises a fault monitoring timer section 25 for monitoring the fault memory control table 22a.

The function of the fault recovery section 21a, which is the same as that of the first embodiment of FIG. 1, is to send memory identification information for identifying a memory at fault.

The fault memory control section 24a searches the fault memory control table 22a based on the received memory identification information and determines whether or not the memory identification information of the memory in error is already registered to execute processing according to the determination. More specifically, when the memory identification information is not registered, the section 24a registers the received memory identification information in the fault memory control table 22a, while starting the fault monitoring timer section 25. When the memory identification information is already registered, the section 24a instructs the processing units 11 and 12 to execute degradation of the memory specified by the memory identification information.

The fault monitoring timer section 25 monitors the memory identification information 51 registered in the fault memory control table 22a, measures a time elapsed since the registration, and deletes the memory identification information 51 of a block area whose registration time period exceeds a prescribed time period. The prescribed time period set for the fault monitoring timer 25 is selected to be adequate for determining a former memory fault not to be a fixed fault if no subsequent error has occurred in the memory.

FIG. 6 illustrates an example of an arrangement of the fault memory control table 22a. There is shown the table area 41a for the processing unit 11 provided in the fault memory control table 22a. Similar area is provided for memory identification information of the processing unit 12, illustration of which is omitted from FIG. 6.

Provided in the table area 41a is a plurality of block areas 41a-1 to 41a-n corresponding the memories "1" to "n" contained in the processing unit 11. Each of the block areas 41a-1 to 41a-n registers the memory identification information 51 and registration time and date information 52 of the corresponding one of the memories "1" to "n". At the time of the new registration of the memory identification information 51, the fault memory control section 24a registers the time and the date of the registration as the registration time and date information 52 in 41a-1 to 41a-n. When the fault monitoring timer section 25 is activated, it measures a time elapsed since the registration time and date specified by the registration time and date information 52 in the table area 41a.

Figure 5:
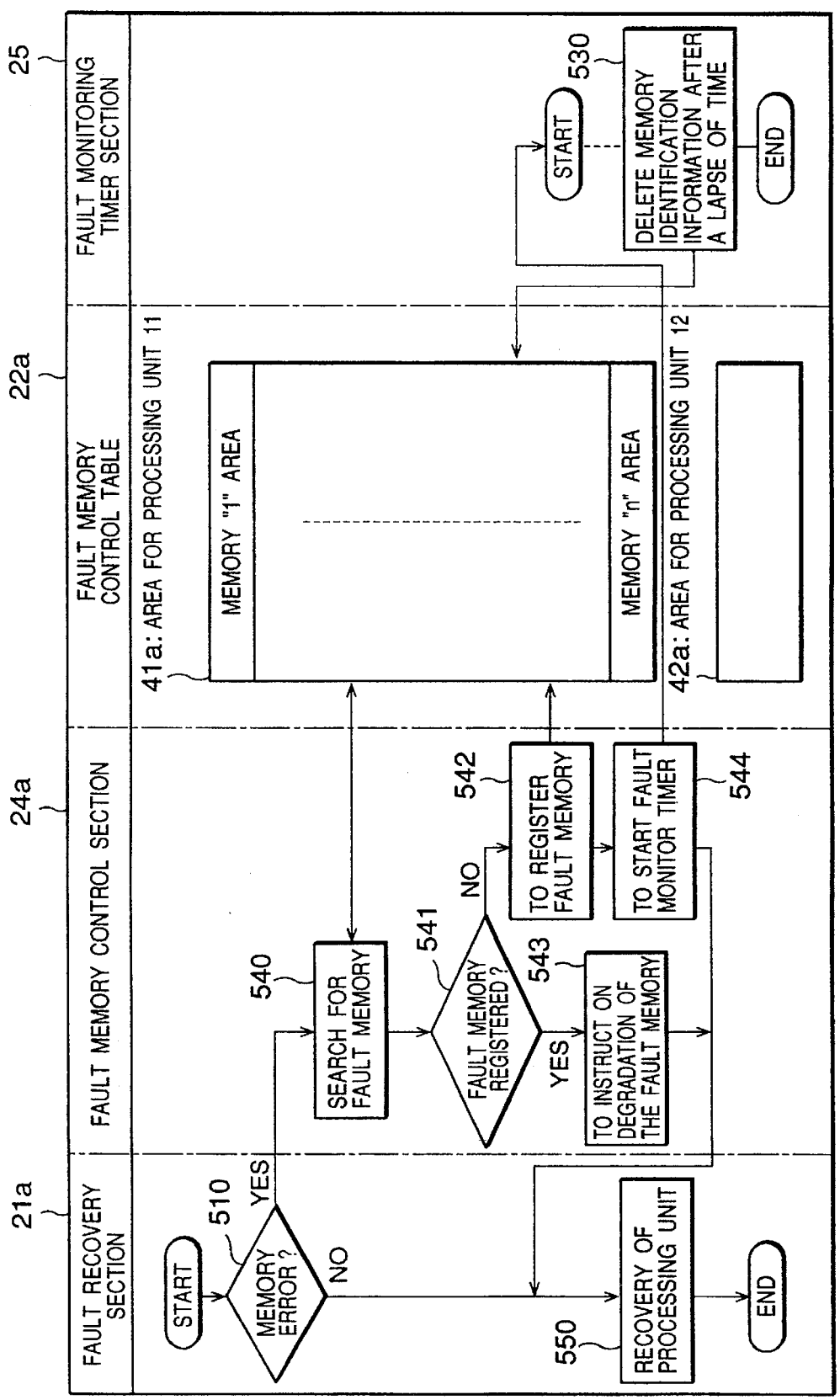
FIG. 5 is a flow chart illustrating operation of the memory fault recovery system according to the second embodiment.

With reference to FIG. 5, description will be given of the operation of the memory fault recovery system 20a according to the second embodiment.

First, the fault recovery section 21a determines whether an error occurs in a memory in the processing units 11 and 12 (Step 510). When the determination is made that an error arises, the section 21a sends to the fault memory control section 24a the memory identification information 51 for identifying the memory in error to call up the fault memory control section 24a.

Based on the memory identification information 51 received from the fault recovery section 21a, the fault memory control section 24a searches the areas 41a and 42a corresponding to the processing units 11 and 12 in the fault memory control table 22 (Step 540).

Then, based on the search result of the fault memory control table 22a, the fault memory control section 24a determines whether the memory identification information 51 of the memory in error is already registered in a corresponding one of the block areas (41a-1 to 41a-n) in the areas 41a and 42a (Step 541).

When the memory identification information 51 of the memory in error is not registered in the fault memory control table 22a, which indicates that the memory has newly developed an error, the fault memory control section 24a registers the received memory identification information 51 and information 52 on the time and date of its registration in a corresponding one of the block areas (41a-1 to 41a-n) in the areas 41a and 42a of the fault memory control table 22a (Step 542).

After newly registering the memory identification information 51, the fault memory control section 24a starts the fault monitoring timer section 25 (Step 544). The fault monitoring timer section 25 fetches registration time and date information 52 of registered fault memory identification information 51 from the areas 41a and 42a corresponding to the processing units 11 and 12 in the fault memory control table 22a and measures a time elapsed since the registration of each memory identification information 51 to delete memory identification information 51 whose registration time period exceeds a fixed time period (prescribed time period) (Step 530).

In Step 541, when the memory identification information 51 of the memory in error is registered in the fault memory control table 22a, the determination is made that the memory has a fixed fault, in the same manner as in the first embodiment, and the section 24a sends instructions on the degradation of the memory area indicated by the memory identification information 51 to the processing unit 11 or 12 that includes the memory in error (Step 543). Then, based on the degradation instructions from the fault memory control section 24a, the fault memory recovery section 21a executes degradation or recovery of the memory such as memory clear and correction for the processing unit 11 or 12 stopped due to the memory fault (Step 550).

As described above, in the second embodiment, determination as to whether a memory fault is temporal (intermittent) or fixed, that is, determination whether to execute memory degradation is made based on whether memory identification information 51 of the memory in error is registered in the fault memory control table 22a, which process is the same as in the first embodiment. Additionally in the second embodiment, if no error has occurred over a lapse of a fixed time period in a memory specified by memory identification information once registered in the fault memory control table 22a, the determination is made that the memory fault is not fixed but temporal (intermittent) to delete the memory identification information. It is therefore possible to more accurately distinguish between a temporal (intermittent) fault and a fixed fault.

The reason is as follows. In the first embodiment, once registered memory identification information 51 remains without being deleted. Therefore, if an error occurs at a long interval in a memory whose memory identification information 51 has been registered because of its memory fault (which can not be determined to be a fixed fault), degradation of memory is inevitably executed.

On the other hand, in the second embodiment, memory identification information 51 whose registration time period exceeds a fixed time period (a time period long enough to determine a fault not to be fixed) is deleted from the fault memory control table 22a. Therefore, if a memory, whose memory identification information 51 has been registered, newly develops an error after a lapse of a fixed time period, another registration is made but no degradation of memory is executed because the former registration is deleted.

The foregoing processing enables accurate discrimination between a temporal (intermittent) memory fault and a fixed fault to reduce the frequency of degradations.

The third embodiment of the present invention will be described in the following. The entire structure of the memory fault recovery system 20b is the same as that of the second embodiment as illustrated in FIG. 4. More specifically, the system 20b comprises a fault recovery section 21b, a fault memory control table 22b, a fault memory control section 24b and a fault monitoring timer section 25b.

The function of the fault recovery section 21b is to send memory identification information for identifying a memory at fault to the fault memory control section 24b, while executing recovery of the processing units 11 and 12 according to a fault recovery mode for the memory indicated by the fault memory control section 24b.

The fault memory control section 24b searches the fault memory control table 22b based on the received memory identification information, determines whether or not the memory identification information of the memory in error is already registered, registers new memory identification information, stars the fault monitoring timer section 25b and counts up the number of occurrences of error according to the determination contents, while selectively giving instructions on the fault recovery mode for the memory with reference to the processing mode designation area.

When the memory identification information is not registered, the fault memory control section 24b newly registers the received memory identification information in the fault memory control table 22b, while starting the fault monitoring timer section 25b. When the memory identification information is already registered, the section 24b counts up the number of occurrences of error of the memory. Then, referring to the processing mode designation areas based on the number of error occurrences registered in the fault memory control table 22b for each memory, the fault memory control section 24b decides and designates a recovery mode for the memory specified by the memory identification information.

The fault monitoring timer section 25b monitors the memory identification information 51 registered in the fault memory control table 22b, measures a time elapsed since the registration, and deletes memory identification information 51 in a block area whose registration time period exceeds a prescribed time period.

FIG. 8 illustrates an example of an arrangement of the fault memory control table 22b. There is shown a table area 41b for the processing unit 11 provided in the fault memory control table 22b. Similar area is provided for registering memory identification information of the processing unit 12, illustration of which is omitted from FIG. 8.

Provided in the table area 41b are a plurality of block areas 41b-1 to 41b-n corresponding to the memories "1" to "n" contained in the processing unit 11. Each of the block areas 41b-1 to 41b-n registers the memory identification information 51, registration time and date information 52 and the number of occurrences of error 53 of the corresponding one of the memories "1" to "n". At the time of the new registration of the memory identification information 51, the fault memory control section 24b registers the time and the date of the registration as the registration time and date information 52 in 41b-1 to 41b-n and an initial value "1" of the number of occurrences of error 53. When activated, the fault monitoring timer section 25b measures a time elapsed since the registration time and date specified by the registration time and date information 52 in the table area 41b.

FIG. 9 illustrates an example of an arrangement of a processing mode designation area 61 provided in the fault memory control table 22b. As shown in the figure, the processing mode designation area 61 is provided with a plurality of block areas 61-1 to 61-n corresponding to the memories "1" to "n" contained in the processing unit 11. Each of the block areas 61-1 to 61-n is further divided into a V field 71, an recovery mode field 72 and a reference error count field 73.

The V field 71 stores information indicating that information of the block areas 61-1 to 61-n is valid or invalid. The recovery mode field 72 stores the contents, which are set for each number of error occurrences, of fault recovery modes for the memories corresponding to the block areas 61-1 to 61-n. In addition to the degradation mode, the fault recovery mode includes the memory clear mode, the memory correction mode and the mode for not executing any special fault recovery. The recovery mode field 72 indicates degradation or clear only, or a combination of degradation and clear as a continuation mode. This indication serves to give adequate fault recovery instructions according to the number of occurrences of error in each memory.

The contents of the processing registered in the recovery mode field 72 is provided individually for each memory.

More specifically, an optimum processing mode is set according to the state of a memory. For example, set as the processing mode for a memory recoverable by memory clear which follows degradation are memory degradation and memory clear. For another memory which is recoverable by memory correction following degradation, memory degradation and memory correction are set as the processing mode. Also provided is a mode for not executing any special fault recovery.

The reference count field 73 registers the number of error occurrences, which is a reference to be made for determining recovery processing for a memory fault. As to the reference number of error occurrences, a plurality of values are provided for each of the fault recovery modes. Then, the values of the reference number of error occurrences correspond to the fault recovery modes registered in the recovery mode field 72. For example, "2" is set as the reference number of error occurrences for the memory clear mode designated in the recovery mode field 72, "3" for the degradation mode and "1" for the mode for no special processing. In other words, separate reference numbers of error occurrences are provided for the determination of a fixed memory fault requiring degradation and for the determination of other recoverable temporal (intermittent) memory faults.

Comparison is made between the number of error occurrences registered in the table area 41b and the reference number of error occurrences registered in the reference error count field 73 to selectively designate a fault recovery mode corresponding to the matched reference number of error occurrences. An individual reference number of error occurrences registered in the reference error count field 73 is set for each memory.

Figure 7:
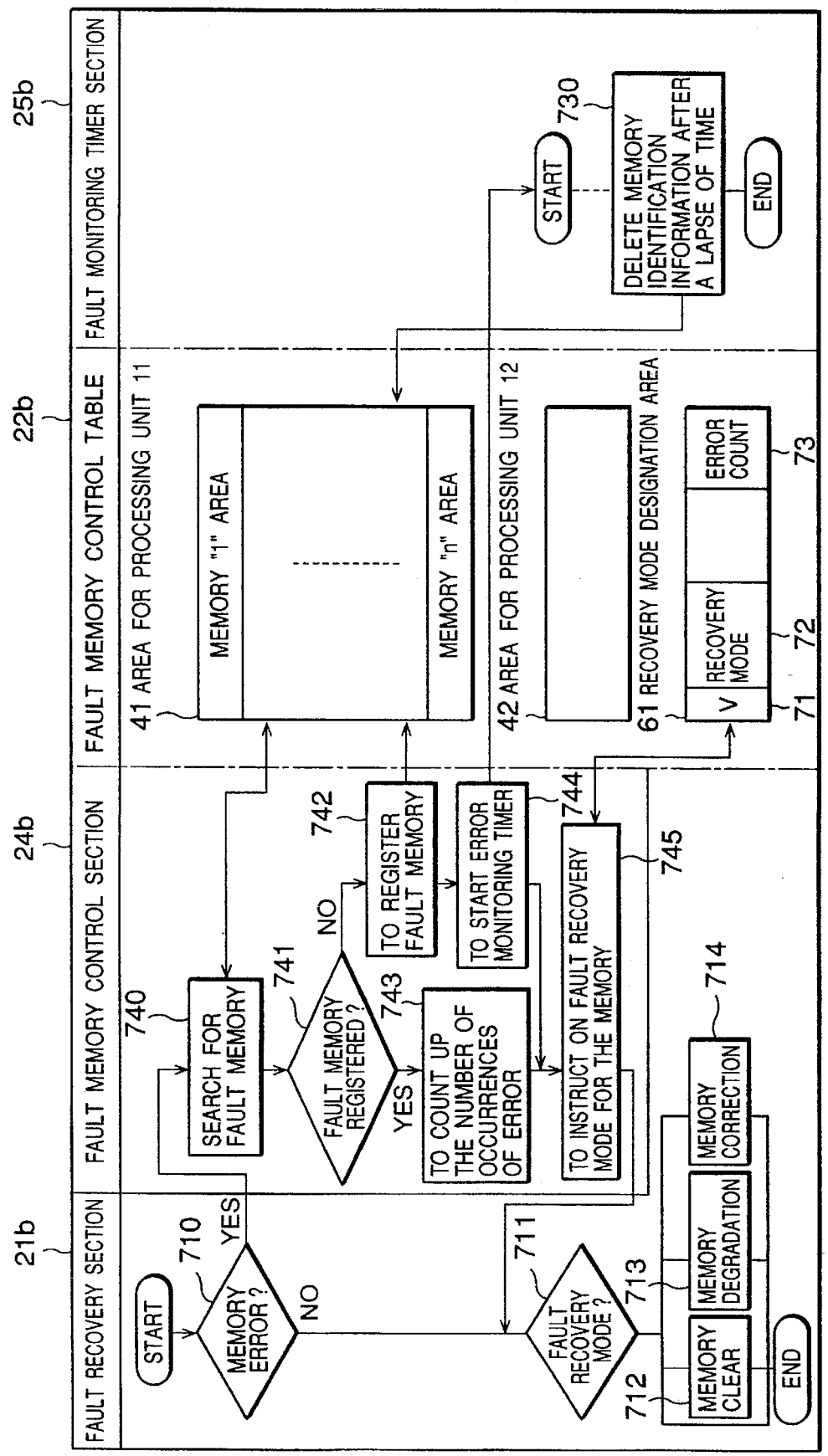
FIG. 7 is a flow chart illustrating operation of a memory fault recovery system according to a third embodiment.

With reference to FIG. 7, description will be given of the operation of the memory fault recovery system 20 according to the third embodiment.

First, the fault recovery section 21b determines whether an error occurs in a memory in the processing units 11 and 12 (Step 710). When the determination is made that an error arises, the section 21b sends to the fault memory control section 24b the memory identification information 51 for identifying the memory in error to call up the fault memory control section 24b.

Based on the memory identification information 51 received from the fault recovery section 21b, the fault memory control section 24b searches the areas 41b and 42b corresponding to the processing units 11 and 12 in the fault memory control table 22b (Step 740).

Then, based on the search result of the fault memory control table 22b, the fault memory control section 24b determines whether the memory identification information 51 of the memory in error is already registered in a corresponding one of the block areas (41b-1 to 41b-n) in the areas 41b and 42b (Step 741).

When the memory identification information 51 of the memory in error is not registered in the fault memory control table 22b, which indicates that the memory has newly developed an error, the fault memory control section 24b registers the received memory identification information 51 and further registers the registration time and date information 52 and the number of error occurrences 53 (initial value "1") in a corresponding one of the block areas (41b-1 to 41b-n) in the areas 41b and 42b of the fault memory control table 22b (Step 742).

After newly registering the memory identification information 51, the fault memory control section 24b starts the fault monitoring timer section 25b (Step 744). The fault monitoring timer section 25b fetches registration time and date information 52 of registered fault memory identification information 51 from the areas 41b and 42b corresponding to the processing units 11 and 12 in the fault memory control table 22b, and measures a time elapsed since the registration of each memory identification information 51 to delete memory identification information 51 whose registration time period exceeds a fixed time period (prescribed time period) (Step 730).

In Step 741, when the memory identification information 51 of the memory in error is already registered in the fault memory control table 22b, the fault memory control section 24b counts up (by +1) the number of occurrences of error 53 of the corresponding one of the memory block areas 41b-1 to 41b-n (Step 743).

After the Step 744 or 743, the fault memory control section 24b compares each number of occurrences of error 53 in the block areas 41b-1 to 41b-n of the fault memory control table 22b with each reference number of occurrences of error in the reference error count field 73 of the processing mode designation area 61 and selects, from the recovery mode field 72, a fault recovery mode corresponding to a reference number of occurrences of error matching the number of occurrences of error 53 of each memory to give the instructions on the fault recovery mode to the fault recovery section 21b (Step 745).

Upon receiving the fault recovery mode instructions, the fault recovery section 21b recognizes the contents of the fault recovery mode (Step 711) to execute recovery of the processing unit 11 or 12 stopped due to a memory fault according to the instructions on the fault recovery mode. For example, when the fault recovery mode is for degradation processing, memory is degraded (Step 713). For the fault recovery mode for memory clear processing, the memory is cleared (Step 712) and for the fault recovery mode for memory correction processing, the memory is corrected (Step 714). For the fault recovery mode for executing no special fault recovery processing, no recovery is carried out.

As described in the foregoing, the memory fault recovery system 20b of the third embodiment executes fault recovery of a memory, which is specified by memory identification information once registered in the fault memory control table 22b because of a memory error, by determining whether the fault is fixed or temporal (intermittent) based on the number of occurrences of error, in addition to deletion of registered information according to a time elapsed since the registration. It is therefore possible to more accurately distinguish between a temporal fault (intermittent) and a fixed fault. Furthermore, selective execution of fault recovery processing according to the number of occurrences of error enables adequate fault recovery.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A memory fault recovery system in an information processor comprising:

fault recovering means for detecting a memory fault occurring in each memory of a plurality of logic units contained in an information processor and recovering the memory fault;

fault memory registering means for registering an identification information of said memory whose fault is detected;

fault memory controlling means for searching said fault memory registering means for the identification information of a memory whose fault is detected by said fault recovering means to instruct said fault recovering means on degradation of said memory indicated by said identification information when the identification information of said memory whose fault is detected is registered and to newly register the identification information of said memory whose fault is detected in said fault memory registering means when the identification information is not registered; and registration monitoring means for measuring a time elapsed since the fault memory controlling means registered the identification information of the memories registered in the fault memory registering means to delete the identification information of a memory whose registration time period exceeds a fixed time period.

2. The memory fault recovery system in the information processor according to claim 1, wherein said fault memory registering means includes a table having areas corresponding to each memory of said plurality of logic units, for storing said identification information; and said fault memory controlling means registers the identification information of said memory whose fault is detected in the corresponding one of the areas in the table.

3. The memory fault recovery system in the information processor according to claim 1, wherein said fault memory registering means includes a table having areas corresponding to each memory of said plurality of logic units for storing said identification information and a registration time and date of said identification information;

said fault memory controlling means registers the identification information and the registration time and date of said memory whose fault is detected in the corresponding one of the areas in the table; and said registration monitoring means measures a time elapsed since the fault memory controlling means registered the identification information based on said registration time and date registered in said fault memory registering means.

4. The memory fault recovery system in the information processor according to claim 1, wherein said registration monitoring means is started every time said fault memory controlling means newly registers the identification information of said memory whose fault is detected in said fault memory registering means.

5. A memory fault recovery system in an information processor comprising:

fault recovering means for detecting a memory fault occurring in each memory of a plurality of logic units contained in an information processor and recovering said memory fault;

fault memory registering means for registering an identification information of the memory whose fault is detected and the number of occurrences of fault for each memory;

processing mode designating means for designating degradation and other recovery modes for said memory whose fault is detected and a reference number of occurrences of fault corresponding to a processing mode for said each memory;

fault memory controlling means for counting a number of occurrences of fault for the identification information in said fault memory registering means when the identification information of the memory whose fault is detected by the fault recovering means is registered in the fault memory registering means, and selecting the recovery modes having the reference number of occurrences of fault matching the number of occurrences of fault in the fault memory registering means to instruct said fault recovering means to execute a recovery; and registration monitoring means for measuring a time elapsed since the identification information is registered in said fault memory registering means to delete the identification information of a memory whose registration period exceeds a prescribed time period.

6. The memory fault recovery system in the information processor according to claim 5, wherein said fault memory registering means includes a table having areas corresponding to each memory of said plurality of logic units for storing the identification information; said number of occurrences of fault and a registration time and date of said identification information;

said fault memory controlling means registers the identification information, the number of occurrences of fault and said registration time and date of the memory whose fault is detected in the corresponding areas of said table; and said registration monitoring means measures a time elapsed since the identification information is registered, based on said registration time and date registered in said fault memory registering means.

7. The memory fault recovery system in the information processor according to claim 5, wherein the registration monitoring means is started every time said fault memory controlling means newly registers the identification information of the memory whose fault is detected in the fault memory registering means.

8. The memory fault recovery system in the information processor according to claim 5, wherein said fault memory controlling means searches said fault memory registering means for the identification information of the memory whose fault is detected by said fault recovering means;

said fault memory controlling means counts the number of occurrences of fault for the identification information in said fault memory registering means when the identification information of said memory whose fault is detected is registered;

said fault memory controlling means newly registers the identification information in said fault memory registering means when the identification information of said memory whose fault is detected is not registered; and said fault memory controlling means selects the recovery mode having the reference number of occurrences of fault matching the number of occurrences of fault in said fault memory registering means to instruct said fault recovering means to execute the recovery.

* * * * *